United States Patent
Robert et al.

(10) Patent No.: US 10,581,474 B1
(45) Date of Patent: Mar. 3, 2020

(54) WIRELESS RECEIVERS AND RELATED METHODS WITH RANDOM INTERFERER IMMUNITY

(71) Applicant: NXP B.V., Eindhoven (NL)

(72) Inventors: Sebastien Robert, Emieville (FR); Fabian Riviere, Cagny (FR); Franck Bisson, Herouvillette (FR); Nguyen Trieu Luan Le, Cormelles le Royal (FR)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/270,807

(22) Filed: Feb. 8, 2019

(30) Foreign Application Priority Data

Nov. 21, 2018 (EP) ..................................... 18306543

(51) Int. Cl.
| | | |
|---|---|---|
| *H04B 1/00* | (2006.01) | |
| *H04B 1/10* | (2006.01) | |
| *H04B 17/345* | (2015.01) | |
| *H04B 17/318* | (2015.01) | |

(52) U.S. Cl.
CPC ......... *H04B 1/1027* (2013.01); *H04B 17/318* (2015.01); *H04B 17/345* (2015.01)

(58) Field of Classification Search
CPC ... H04B 1/1027; H04B 17/318; H04B 17/345
See application file for complete search history.

(56) References Cited

U.S. PATENT DOCUMENTS

| | | |
|---|---|---|
| 7,263,143 B1 | 8/2007 | Rothaar et al. |
| 7,496,162 B2 | 2/2009 | Srebranig |
| 8,660,221 B2 | 2/2014 | Chen et al. |
| 8,675,789 B2 | 3/2014 | Seller |
| 8,805,284 B2 | 8/2014 | Nejatian et al. |
| 8,903,023 B1 | 12/2014 | Wang et al. |
| 9,083,567 B2 | 7/2015 | Shi et al. |
| 9,544,862 B2 | 1/2017 | Li et al. |
| 9,831,902 B2 | 11/2017 | Moon et al. |
| 2008/0273636 A1* | 11/2008 | Zhu ...................... H03G 3/3078 375/345 |

(Continued)

FOREIGN PATENT DOCUMENTS

| | | |
|---|---|---|
| CN | 105429716 B | 11/2017 |
| JP | 2000252880 | 9/2000 |
| WO | WO-2007089088 A1 | 8/2007 |

*Primary Examiner* — Dac V Ha (57) ABSTRACT

Wireless receivers and related methods with interferer immunity are disclosed. The receiver includes a receive (RX) front-end, a power level detector, and an automatic gain controller (AGC). The RX front-end includes circuit(s) having variable gains, and the power level detector outputs a power level indicator. The AGC receives the power level indicator and outputs the gain settings to the variable-gain circuits within the RX front-end. Further, the AGC is configured to adjust the gain settings within a first gain range when not receiving data frames and to adjust them within a second gain range when receiving data frames. The second gain range is a restricted version of the first gain range. Further, the AGC can be configured to detect and store gain settings within a sliding time window when data frames are not being received and to use these stored gain settings to determine the second gain range.

18 Claims, 6 Drawing Sheets

(56) References Cited

U.S. PATENT DOCUMENTS

| | | | |
|---|---|---|---|
| 2015/0222373 A1* | 8/2015 | Tanaka | H04B 17/21 455/226.2 |
| 2015/0303960 A1* | 10/2015 | Ferrante | H03G 3/3078 455/234.1 |
| 2019/0068153 A1* | 2/2019 | Arslan | H03G 3/001 |

* cited by examiner

FIG. 6

WIRELESS RECEIVERS AND RELATED METHODS WITH RANDOM INTERFERER IMMUNITY

RELATED APPLICATIONS

This application claims priority under 35 USC § 119 to European Patent Application No. 18306543 filed on Nov. 21, 2018, and entitled "WIRELESS RECEIVERS AND RELATED METHODS WITH RANDOM INTERFERER IMMUNITY," which application is hereby incorporated by reference in its entirety.

TECHNICAL FIELD

This technical field relates to receiving radio frequency (RF) transmissions and, more particularly, to countering interfering signals present during the reception of RF transmissions.

BACKGROUND

Increasing numbers and types of devices are becoming portable and non-portable wireless devices. The proliferation of portable connected devices such as mobile phones, laptops, smart watches, tablets etc. as well as non-portable connected devices such as televisions, video game consoles, appliances, etc. have saturated many environments with radio frequency (RF) signals. Due to this proliferation of RF signals, connected devices receive many unwanted signals, called interferers, in addition to receiving desired RF signals from communication partner device(s). The interferers can occur in a random and unpredictable manner. For example, interferers can occur in the form of signal bursts of variable duration and have signal strengths possibly much higher than the desired signal at the receiving device. Interferers with a high signal strength can cause saturation of the receive circuitry thereby preventing proper reception of the desired data.

Many prior solutions have addressed this interferer issue by continuously monitoring the received signal strength and immediately adjusting amplifier gains to avoid saturation while still maintaining sensitivity levels for the receiving device. However, when operating within popular wireless communication protocols such as IEEE (Institute of Electrical and Electronics Engineers) 802.11 protocols for Wireless Personal Area Networks (e.g., WiFi) or IEEE 802.15.4 protocols for Wireless Personal Area Networks (e.g., Bluetooth, Zigbee), the receiver is often not allowed by these protocols to adjust gain during reception of the data payload. Due to these limitations, prior receiver solutions for these communication protocols adjust the gain during a time interval prior to the payload reception. This gain adjustment is typically based upon the real-time received signal, and the gain adjustment is fixed just before switching to the payload reception period. The inability to perform gain adjustments during payload reception, however, can cause degradation in receiver performance. For example, due to their random nature in occurrence and strength level, interferers may appear during payload reception and cause saturation of the receive circuitry resulting in data loss due the inability to adjust the fixed gain settings set prior to the payload reception period.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Wireless receivers and related methods with interferer immunity are disclosed. The disclosed embodiments determine variable gain settings for reception of radio frequency (RF) signals based upon past information on detected interferers thereby allowing receiver gain settings to achieve improved and/or optimum trade-offs between reception sensitivity and random interferer immunity. For example, past information for the signal strength of interferers is considered to control the actual gain adjustment for variable gain circuits including amplifiers within a receiver. For receivers operating within protocols that do not allow gain adjustments during payload reception such as the IEEE 802.11 protocol and the 802.15.4 protocol, the disclosed techniques allow receivers to have higher immunity to interferers even if the interferers occur during the gain-frozen payload reception period while still maintaining adequate and preferably optimum sensitivity levels. A variety of additional and/or different features and variations can also be implemented.

For one embodiment, gain settings for variable gain circuits within a receive (RX) front-end are determined and stored at regular time points during a sliding time window when the receiver is not receiving a data payload. These gain settings are assumed to correspond to the presence or lack of interferers being received by the receiver during this sliding time window. For example, a low gain setting is indicates that an interferer has been received, while a high gain setting indicates that interferers are likely not present. Based upon the gain settings for prior interferers within the sliding time window, a restricted gain range is determined and later applied for a gain adjustment phase during reception of the preamble for a data frame. The receiver thereby determines the most appropriate gain levels for the restricted gain range based upon past interferers and applies this gain range as a control input for gain adjustment during the preamble phase before the gain-freeze period during data payload reception. The past interferer information improves the possibility of capturing and identifying the most likely worst-case and/or recurring interferers a receiver will likely experience during reception of data frames and makes the overall system more robust against interferers that may occur during data payload reception. The sliding time window allows the receiver to adapt to the actual environmental conditions, and the receiver can be continually adjusted to have an increased or preferably optimum sensitivity level while still maintaining adequate immunity to interferers. For certain embodiments, the receiver wakes up from a power saving mode to perform interferer tracking, and the time intervals between tracking points for detecting the gain settings can be dynamically controlled, for example, based upon the expected frequency of interferers. Further, the receiver can suspend the interferer tracking operation based on indication of a co-located communication device that may communicate with other devices as such co-located communication devices can lead to unneeded gain limits. Additional and/or different features can also be provided while still taking advantage of the techniques described herein.

Figure 1:
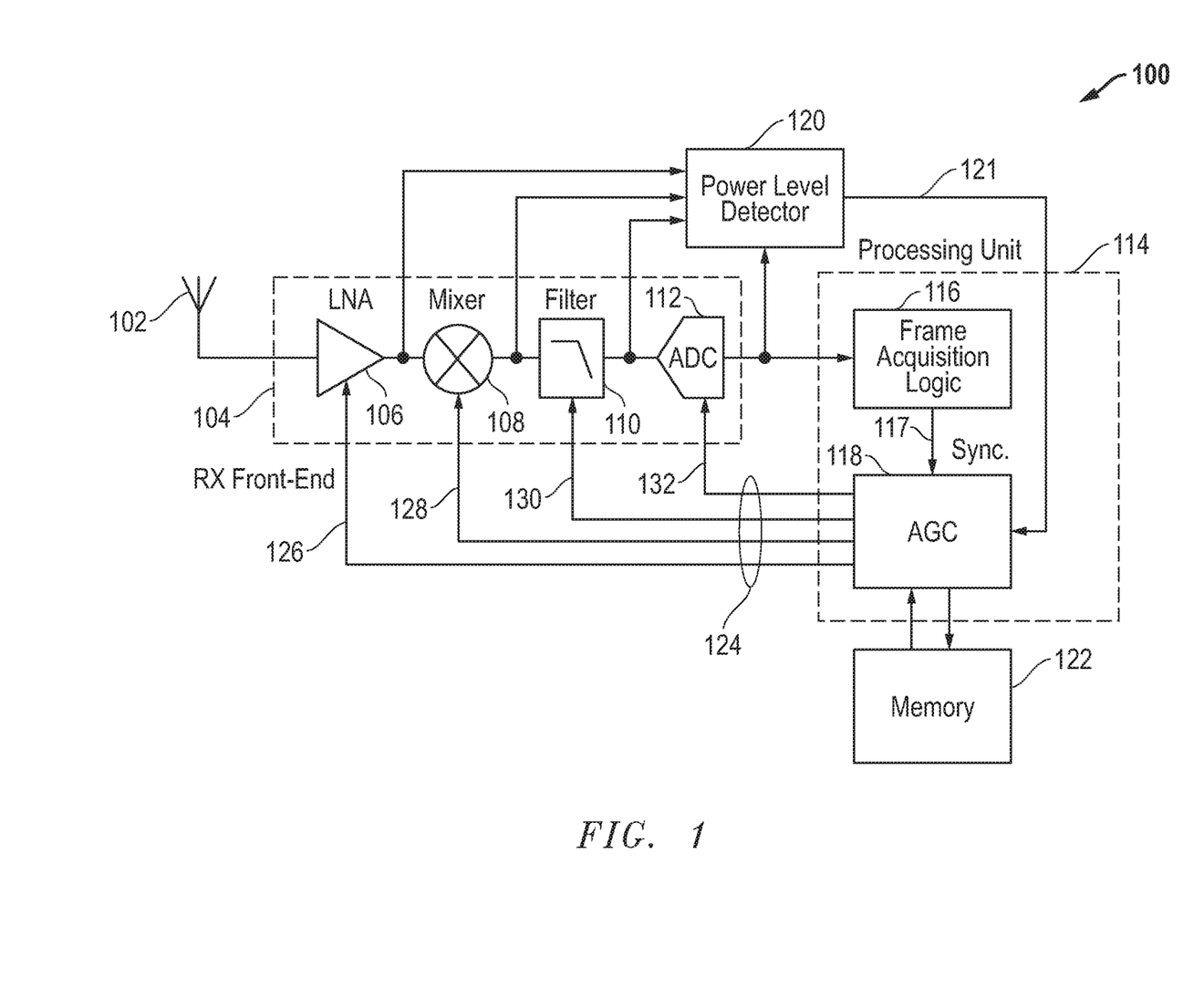
FIG. 1 is a block diagram of an example embodiment for a receiver including an automatic gain controller (AGC) according to the disclosed embodiments.

FIG. 1 is a block diagram of an example embodiment for a receiver 100. The receiver includes a receive (RX) front-end 104, a power level detector 120, a processing unit 114, and memory 122. The amplifier 106, such as a low noise amplifier (LNA), within the RX front-end 104 is connected to an antenna 102 to receive RF signals. The RF signals can include signals with frequencies of hundreds of Hertz (Hz) to five Giga-Hertz (GHz) and above. In addition to receiving desired RF signals that include data frames communicated from communication partner devices, the RX front-end 104 will typically also receive undesired interferers. In addition to the amplifier 106, the RX front-end 104 also includes a mixer 108, a filter 110, and an analog-to-digital converter (ADC) 112. The amplifier 106 receives the RF signals and outputs an amplified RF signal to the mixer 108. The mixer 108 down-converts the amplified RF signal from the amplifier 106 down to a lower frequency. The filter 110, which can be a low-pass filter, receives the down-converted RF signal and passes a filtered signal to the ADC 112. The ADC 112 converts the down-converted and filtered RF input signal to digital signals that are provided to the processing unit 114.

For the embodiment 100 depicted, the processing unit 114 includes frame acquisition logic 116 and an automatic gain controller (AGC) 118. One or more of the circuits within the RX front-end 104 can be a variable gain circuit and receive gain settings 124 from the AGC 118. For the embodiment 100 depicted, the gain settings 124 from the AGC 118 include an amplifier gain setting 126 applied to the amplifier 106, a mixer gain setting 128 applied to the mixer 108, a filter gain setting 130 applied to the filter 110, and an ADC gain setting 132 applied to the ADC 112. As described in more detail below, one of these gain settings 124, all of these gain settings 124, and/or a subset of these gain settings 124 can be implemented for a particular receiver. Further, different or additional gain settings can also be used while still taking advantage of the techniques described herein.

In operation, the AGC 118 provides gain settings 124 to one or more of the circuits within the RX front-end 104 to control their variable gain(s). The AGC 118 receives a power level indicator 121 from the power level detector 120. While individual gain settings 126/128/130/132 are shown being provided to each of the circuits within the RX front-end 104 (e.g., LNA 106, mixer 108, filter 110, ADC 112), it is understood that different embodiments can be implemented where only one, all, or a subset of the circuits within the RX front-end 104 receive control signals form the AGC 118. Similarly, while the power level detector 120 is shown as receiving the outputs of the LNA 106, mixer 108, filter 110, and ADC 112, it is understood that different embodiments can be implemented where the power level detector 120 receives outputs from only one, all, or a subset of the circuits within the RX front-end 104. For one example embodiment, the power level detector 120 is coupled only to the output of the LNA 106, and the AGC 118 adjusts only the gain setting 126 for the LNA 106. In another example embodiment, the power level detector 120 is coupled to the output of a plurality of the circuits in the RX front-end 104 that have variable gains, and the AGC 118 independently adjusts gain settings for each of these variable-gain circuits. The AGC 118 is also coupled to frame acquisition logic 116. The frame acquisition logic 116 receives the digital signals output by the ADC 112, and the frame acquisition logic 116 outputs control signals such as synchronization indicator 117 to the AGC 118. The AGC 118 is coupled to memory 122 to store and retrieve gain settings as described in more detail below. Other variations can also be implemented.

For many communication protocols, the RF input signals will include data frames, and these data frames can include a preamble, a start-of-frame, a data payload, and/or other fields or components. For one embodiment, the frame acquisition logic 116 operates to detect different portions of received data frames as well as to provide the frame synchronization indicator 117 to the AGC 118. For some embodiments, the data frames are formed according to wireless communication standards such as various data frame formats provided by the IEEE 802.11 protocol (e.g., 802.11 a/b/g/n/ac) or the IEEE 802.15.4 protocol. Although the exemplary embodiment described below is based on the IEEE 802.15.4 data frame format that includes a preamble, a start of frame, and a payload, the disclosed embodiments can be used with other data frame formats.

Figure 2:
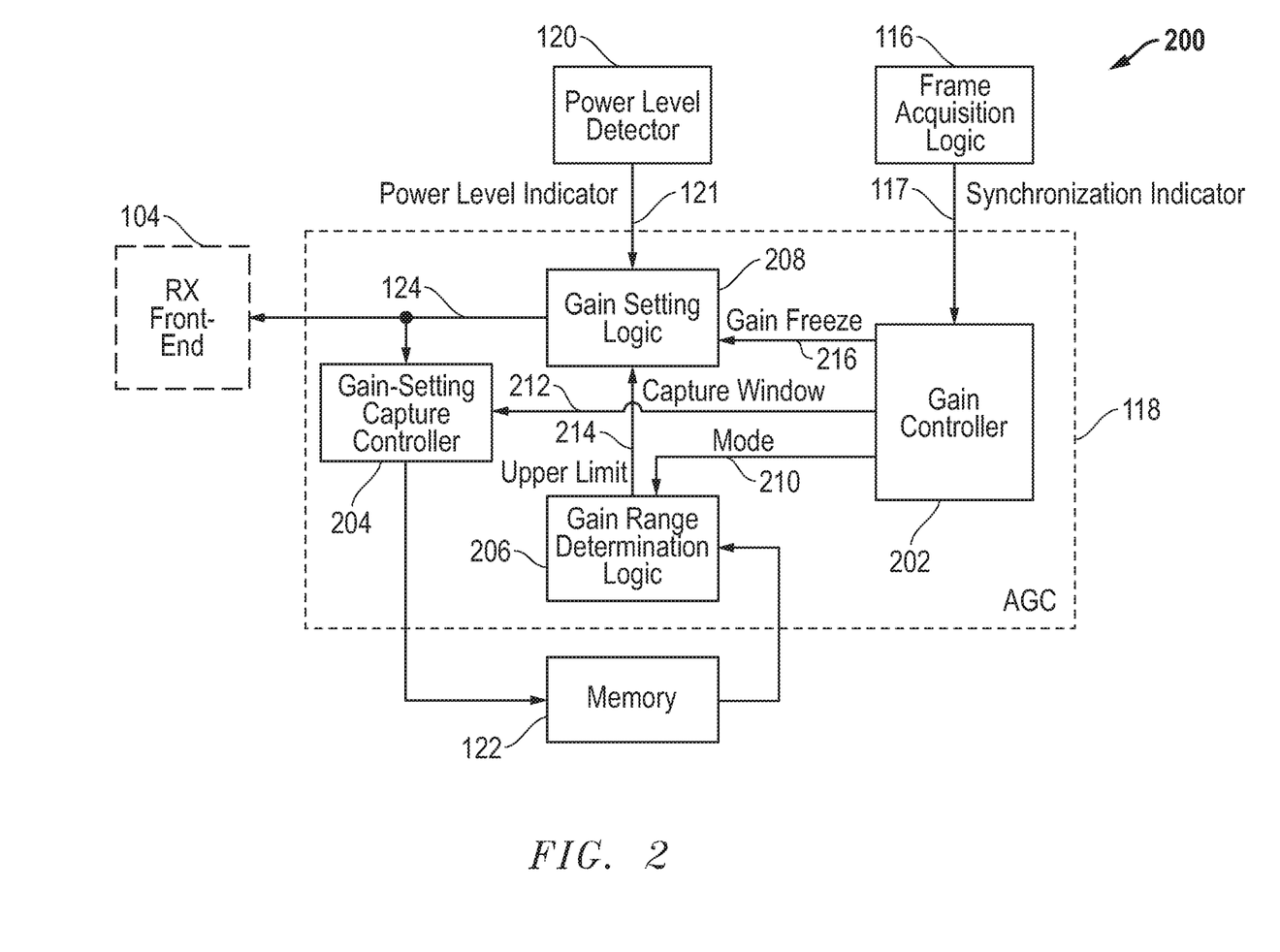
FIG. 2 is a block diagram of an example embodiment including example internal controllers and related logic for an AGC according to the disclosed embodiments.

FIG. 2 is a block diagram of an example embodiment 200 including example internal controllers and related logic for the AGC 118. For the example embodiment 200, the AGC 118 includes gain controller 202, gain-setting capture controller 204, gain range determination logic 206, and gain setting logic 208. As described herein, the AGC 118 stores gain settings during a sliding time window and determines a restricted gain range including an upper limit based on gain setting information identified and stored during this time window. Various determination methods for the gain range and upper limit can be applied depending on the interferer types. FIGS. 3-7 provide example determination methods and timing diagrams according to the disclosed embodiments. Further, it is noted that the processing unit 114 including the AGC 118 and its components can be implemented using one or more programmable circuits that are programmed to perform the functions, tasks, methods, actions, and/or other operational features described herein. It is further noted that the memory 122 can be implemented using one or more non-transitory tangible computer-readable mediums.

In operation, the gain setting logic 208 provides gain settings 124 to set the gain of one or more of the circuits within the RX front-end 104 (e.g., LNA 106, mixer 108, filter 110, and/or ADC 112). Preferably, the gain(s) are set to a maximum value possible in response to the power level indicator 121 from the power level detector 120 without causing saturation within the RX front-end 104. The gain controller 202 allows the gain setting logic 208 to adjust these gains within a first range (e.g., full gain range) when the receiver is outside of data frame reception periods. The gain adjustments are then adjusted within a second range (e.g., restricted gain range) when within preamble reception periods. For example, the second range, which can provided a restricted gain range, can be bounded by an upper limit that is determined by the gain range determination logic 206.

Figure 3:
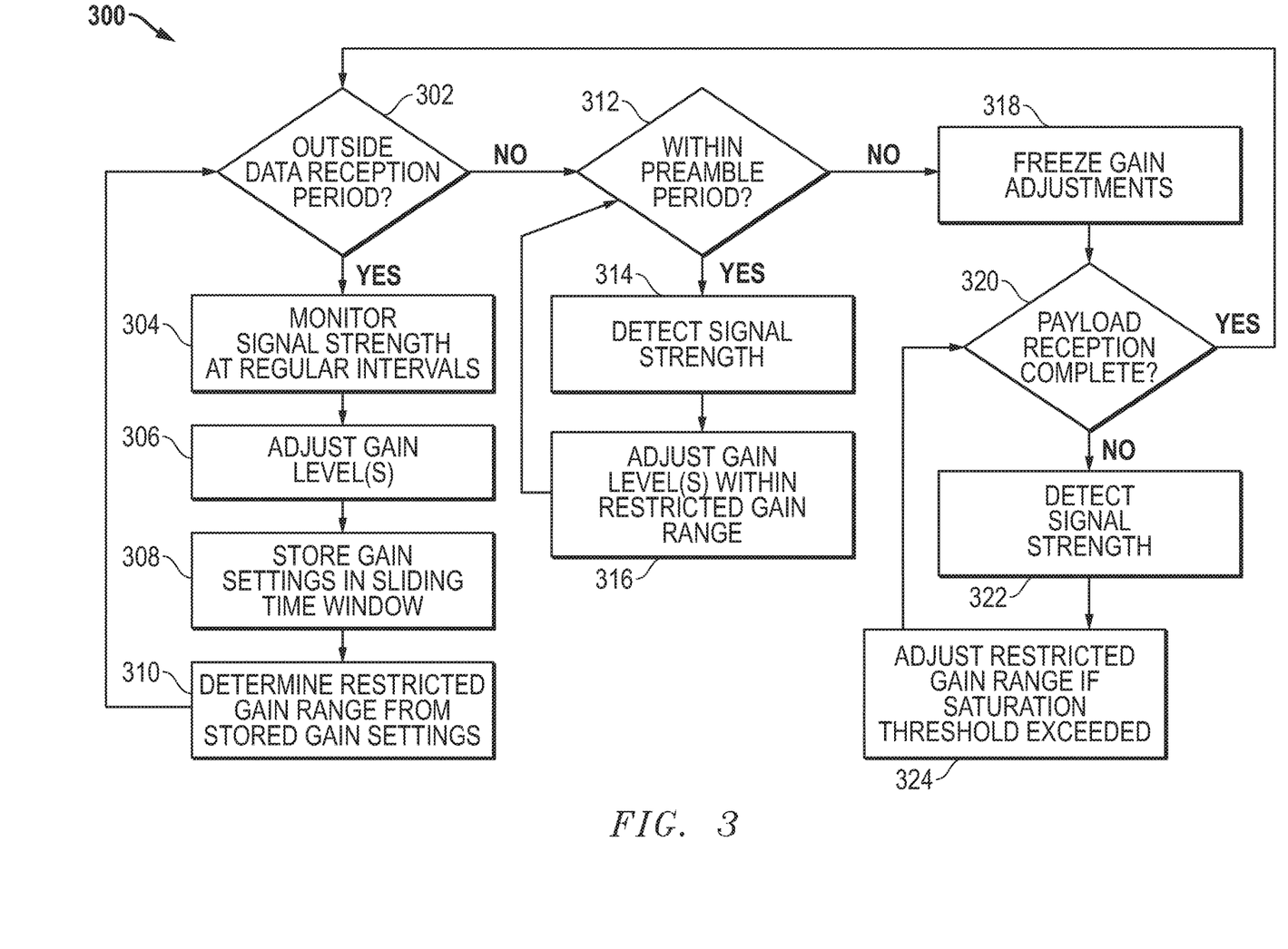
FIG. 3 is process flow diagram of an example embodiment where gain settings are adjusted for one or more circuits within a receive (RX) front-end for a receiver within an interferer tracking phase using a first gain range and a within a payload reception phase using a restricted gain range.
Figure 4:
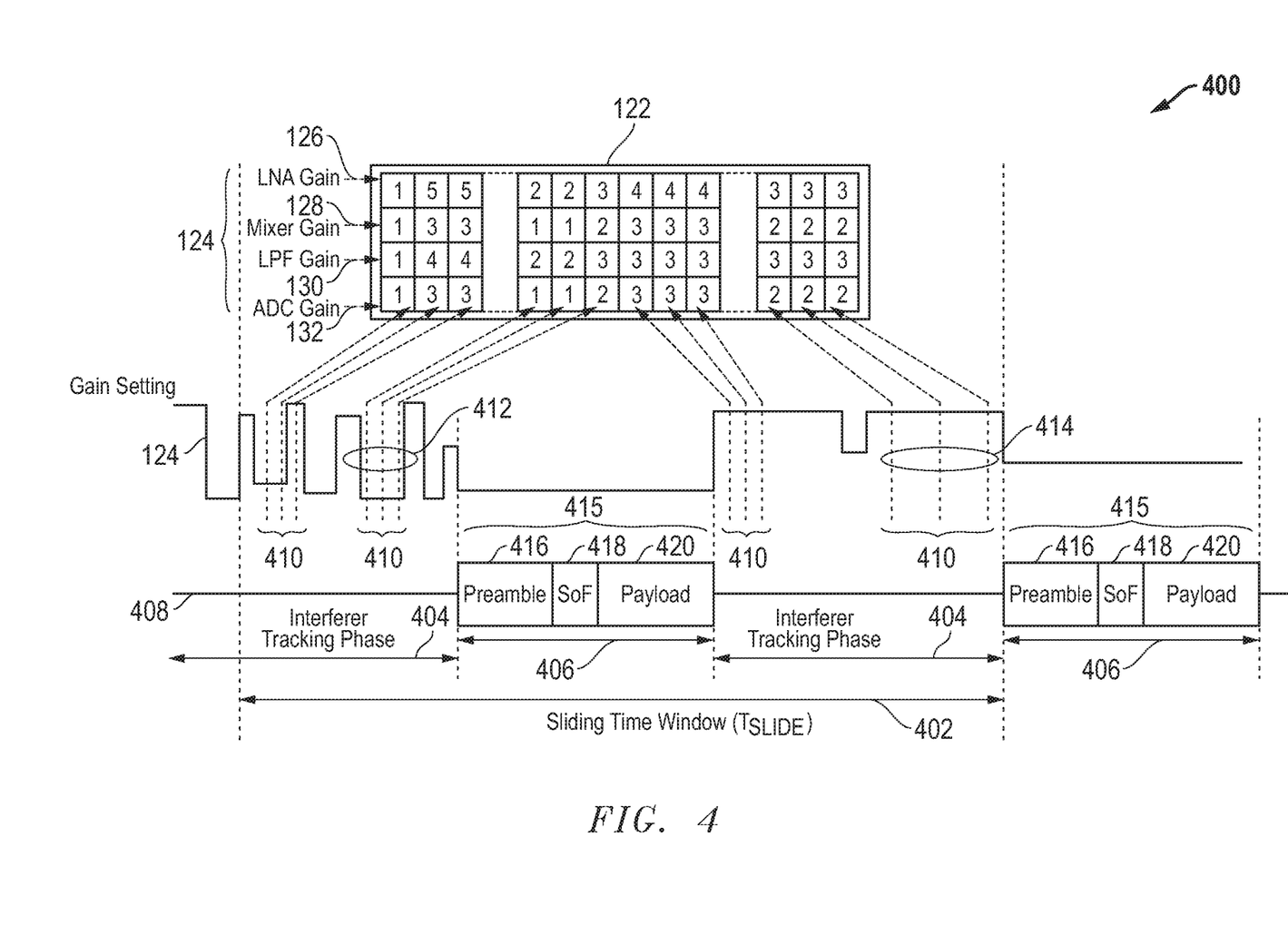
FIG. 4 is a timing diagram of an example embodiment where interferers and gain settings for a receiver are tracked and stored within a sliding time window.

The gain range determination logic 206 has two modes of operation. A first mode is an interferer tracking mode, and a second mode is a preamble gain adjustment mode. The gain controller 202 uses the mode signal 210 to set the operational mode in response to the synchronization indicator 117 received from the frame acquisition logic 116. When no communication packet is being received, the interferer tracking mode (first mode) is selected. In the first mode, the full gain range of the receiver gain stage(s) is made possible to the gain setting logic 208. During the reception of the packet preamble, the preamble gain adjustment mode (second mode) is selected. In this second mode, a restricted gain range is applied to the gain setting logic 208. The restricted gain range is determined by gain range determination logic 206 based on the gain setting history stored in the memory 122. As described further below, various methods can be performed by the gain range determination logic 206 to determine the restricted gain range. FIGS. 3-4 discussed below provide an example method and an example timing diagram, respectively, for the operation of these two modes as described with respect to FIG. 2.

The gain controller 202 enables the storage of gain settings into the memory 122 by the gain-setting capture controller 204 during the interferer tracking mode (first mode). A sliding time window is applied for this data capture based upon the capture window 212 as controlled by the gain controller 202. Gain settings 124 output from the gain setting logic 208 to the gain component(s) within the RX front-end 104 are stored in this sliding time window by having the most recent gain setting(s) replace the least recent gain setting(s) when the memory 122 is entirely filled with data.

FIG. 3 is process flow diagram of an example embodiment 300 where gain settings are adjusted for one or more circuits within the RX front-end for a receiver according to the techniques described herein. In block 302, a determination is made whether the receiver is outside a data reception period. If "YES," then flow passes to block 304 wherein signal strength is monitored at regular intervals. For example, the receiver can wake up at regular time intervals from a power saving mode to monitor the received signal strength using a power level detector 120. In block 306, gain settings for one or more of the circuits within the RX front-end 104 are adjusted using the gain settings 124 to provide increased and preferably an optimum level of sensitivity while avoiding saturation. In block 308, the gain settings 124 are stored in the memory 122 throughout a sliding time window with a predefined duration. In block 310, a restricted gain range is determined based upon the stored gain settings stored within the sliding time window. For example, an upper limit for a restricted gain range can be computed based on the gain settings recorded within the sliding time window. Flow then passes back to determination block 302.

It is noted that the gain adjustments in block 306 are preferably performed using a first gain range, which preferably represents the full or maximum possible gain range for the gain settings. It if further noted that monitoring in block 304 can be performed by waking the receiver up from sleep mode at regular intervals and performing the signal strength detection during these wake-up times. It is also noted that to further save power, the wake-up time interval is preferably adjusted dynamically depending on a detected frequency of interferer occurrences. For example, if the signal strength detection during wake-up times shows that the occurrence of interferes is less frequent, than the wake-up time interval can be increased. If the signal strength detection during wake-up times shows that the occurrence of interferes is more frequent, than the wake-up time interval can be decreased.

In the determination in block 302 is "NO," then the receiver a data reception period and block 312 is reached. In block 312, a determination is made whether the data reception is within a preamble period preceding a data payload period. If "YES," then flow passes to block 314 where signal strength is determined. In block 316, during the preamble period preceding the data payload period, an adjustment is made to gain level(s) within a second gain range that is set by the restricted gain range determined in block 310. The second gain range is a restricted version of the first gain range. Further, this gain adjustment preferably sets the gain level(s) to an optimum gain level for sensitivity while avoiding saturation. It is again noted that gain levels are adjusted by providing gain settings 124 to one or more of the circuits within the RX front-end 104.

If the determination in block 312 is "NO," then block 318 is reached where gain adjustments are frozen during a payload reception period. Flow then passes to block 320 where a determination is made whether the payload reception has completed. If "YES," then flow passes back to block 302. If "NO," then flow passes to block 322 where the signal strength is again detected. In block 324, the restricted gain range is adjusted if a saturation threshold level is exceeded. For example, the upper limit of the restricted gain range (second gain range) can be decreased for the next data frame. Flow then passes back to determination block 320 until the payload reception has completed.

Although not shown in example embodiment 300, it is further noted that interferer tracking operations as well as the storing of gain settings within the sliding time window can be temporarily suspended when a co-located communication device indicates that it is transmitting data. The interferer and gain level tracking is then resumed the once the co-located communication device indicates the end of data transmission to the receiver. It is further noted that different and/or additional process steps can also be used with respect to embodiment 300 while still taking advantage of the techniques described herein.

FIG. 4 is a timing diagram of an example embodiment 400 where interferers and gain settings 124 for a receiver are tracked and stored within a sliding time window ($T_{SLIDE}$) 402. For embodiment 400, signal line 408 represents communications from a communication partner device to the receiver where data frames 415 are communicated to the receiver within communication phases 406. The data frames 415 include a reception period for a preamble 416, a reception period for a start of frame (SoF) 418, and a reception period for a payload 420. In periods where data frames 415 are not being communicated, the receiver enters its interferer tracking phase 404. During these interferer tracking phases 404, gain settings 124 from the AGC 118 are detected at tracking points 410 and stored in the memory 122. For example, the gain settings 126 for the LNA 106, the gain settings 128 for the mixer 108, the gain settings 130 for the filter 110, and/or the gain settings 132 for the ADC 112 can be stored for each tracking point 410. As described herein, the interval between the tracking points can be adjusted. For example, a smaller interval 412 can be used where a higher frequency of interferers is expected, and a larger interval 414 can be sued where a smaller frequency of interferers is expected. It is also noted that the data shown as stored in memory 122 for embodiment 400 is representative only.

To save power in some embodiments, the receiver does not stay continuously in an active reception mode but enters sleep or low power modes between data communications. For example, once a data exchange is completed, the receiver enters a power saving mode until the next data exchange. In the case of Bluetooth (BT) devices, the time interval between data communication events is negotiated between the paired devices. In case of Zigbee devices (e.g., sensors), the data transmission occurs at regular time intervals as defined in the device profile. Between two adjacent communication phases, the receiver is configured to wake-up briefly at one or more points to perform the interferer tracking operations and collect data as shown for example in FIG. 4. For one embodiment, a counter is used to trigger the receiver wake-up for interferer tracking at regular intervals, and the timing for the regular intervals can be adjusted based upon the expected frequency of interferers as described herein.

During an interferer tracking phase 404, the AGC 118 adjusts the gain settings 124 for one or more of the circuits within the RX front-end 104 in response to the power level indicator 121 that is output by the power level detector 120. The power level indicator 121 is indicative of the signal level or strength of the received signal. For one embodiment, the power level detector 120 compares the level of the signal from one or more points within the RX front-end 104 with a predefined saturation threshold and asserts a logic TRUE if the signal level is above the threshold. Otherwise, a logic FALSE is asserted. The AGC 118 monitors the power level indicator 121, progressively decreases the gain when a logic TRUE is received, and progressively increases the gain when a logic FALSE is received. During the interfere tracking phase 404, the gain adjustments are made using a first gain range, such as the full gain range as permitted by the receiver. The gain settings 124 detected at each interferer tracking point 410 are stored into a memory 122. The interferer tracking phase 404 ends at the end of the sliding time window 402.

It is noted that the memory 122 can include a set of registers, a RAM (random access memory), a programmable ROM (read-only memory), non-volatile memory, and/or any suitable memory type that can store the gain settings 124. The size of the memory corresponds to an array of M×N, where M is the number of gain stages (e.g., 1 to 4 for RX front-end 104) and N is the number of tracking points within the sliding time window 402 where the gain settings are being captured. It is further noted that the number of interferer tracking points 410 can be statically controlled where a constant time interval is used between any two tracking points 410 or can be dynamically controlled where the time interval between two tracking points 410 is adjusted over time. Dynamic control allows a good balance between power consumption and accurate tracking. In case numerous interferers are observed and recorded, the time interval between the interferer tracking points 410 can be reduced to increase the number of tracking points and thereby enhance the tracking accuracy. In contrast, if a small number of interferers are observed and recorded, then the receiver may increase the time interval between the interferer tracking points 410 to save power.

An interferer during the interferer tracking phase 404 can be determined to have been received where a relatively low gain setting is recorded. For example, a gain threshold can be used as a trigger level to indicate the receipt of an interferer during the interferer tracking phase 404. If the gain level 124 is set below this threshold level, then it can be assumed that an interferer signal has been received. If the gain level 124 is set above this threshold level, then it can be assumed that an interferer was not received. A count of interferes can then be kept during the sliding time window 402. Further, if a saturation threshold is exceeded during reception periods for the payloads 420, then an interferer can also be determined to have been received and the count can be incremented accordingly.

In the case where the receiver is integrated in a larger system such as a gateway or multi-protocol router as one of several communication devices (e.g., Zigbee along with BT, WiFi, etc.), the level of interferer will likely be extremely high whenever one of the co-located communication devices transmit data due to the proximity of the antennae. Recording the presence of such interferers is to be avoided as this can lead to unnecessary reductions in receiver sensitivity based upon the techniques described herein. As these co-located communication devices are in the same system and likely controlled by a common controller and/or controllers that communicate with each other, exact moments where co-located data transmission are performed by one of these co-located transmission devices can be indicated. For example, such an indication can be generated by the controller for the co-located device, a common controller, and/or some other technique through a collaborative coexistence arbitration mechanism. When an indication of data transmission of one of the co-located communication devices is asserted, a receiver implementing the techniques described herein can suspend the interferer tracking operation until such indicator is de-asserted. When the interferer tracking operations are suspended, interferer related gain settings are not stored.

Figure 5:
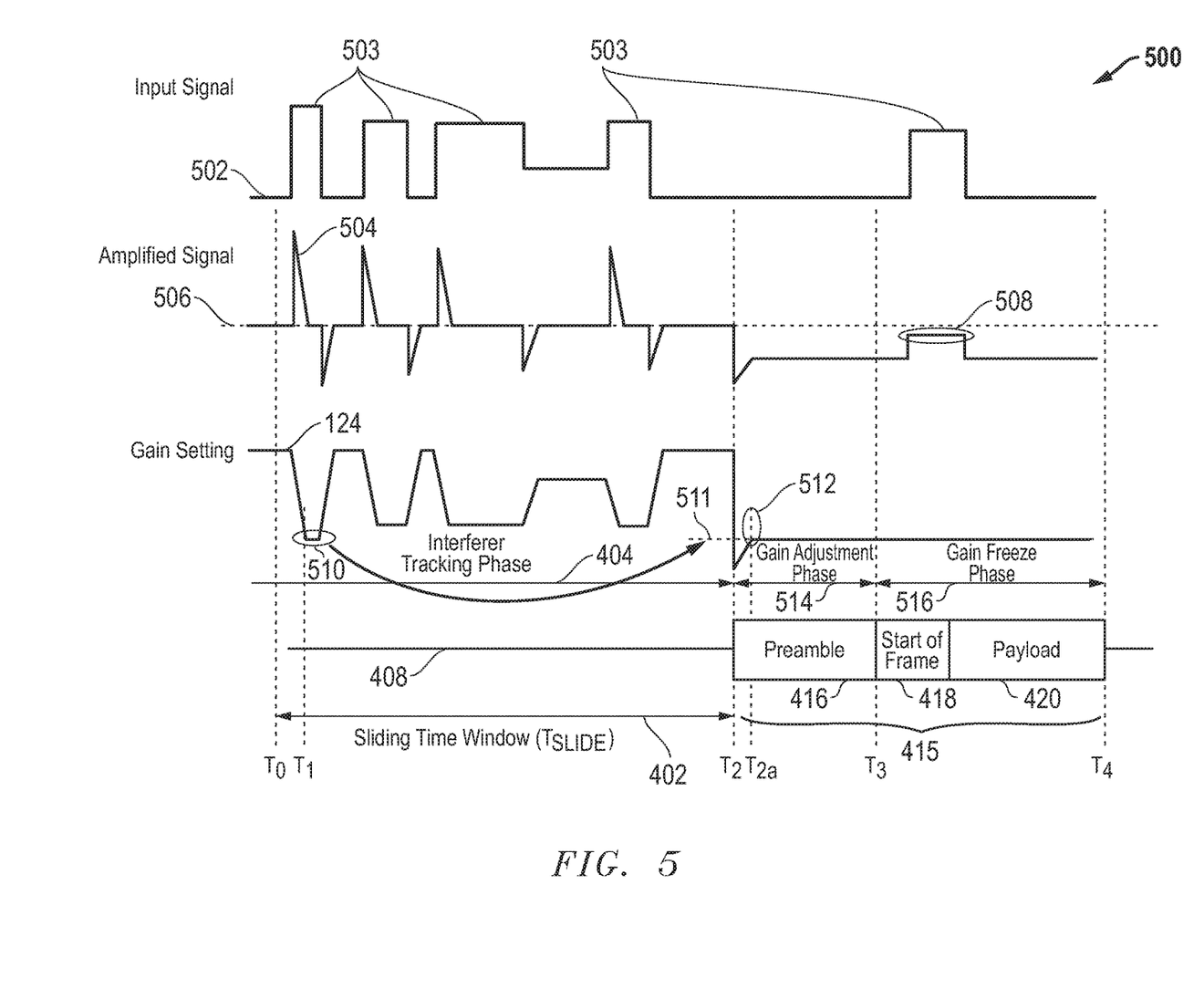
FIG. 5 is a timing diagram of an example embodiment where a minimum gain setting recorded during a sliding time window is used to set limits for the restricted gain range used for payload reception.
Figure 6:
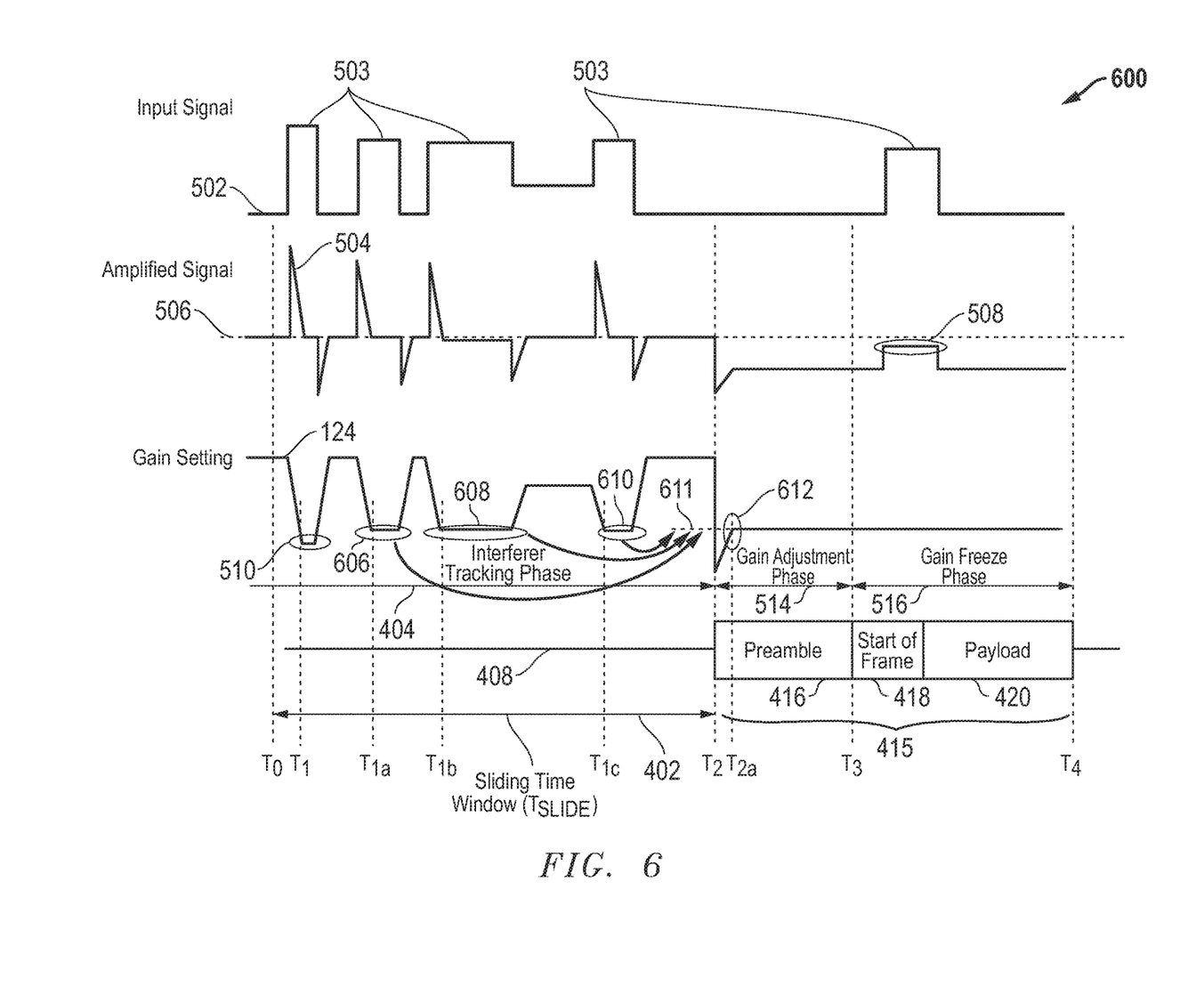
FIG. 6 is an example embodiment of a timing diagram where a recurring interferer with a likelihood of occurrence above a selected threshold is detected and used to set limits for the restricted gain range for payload reception.

FIGS. 5 and 6 provide example embodiments that set limits for the restricted gain range used. For these embodiments, when a preamble 416 is detected, the receiver enters a gain adjustment phase 514. The gain controller 202 adjusts the receiver gain during this preamble reception period in response to the power level detector 120 similar to gain changes during the interferer tracking phase 404, except that a restricted gain range is used instead of the full gain range. An upper limit for this restricted gain range is computed based on the gain settings 124 recorded during the sliding time window 402. It is noted that FIGS. 5 and 6 are just example embodiments and different techniques could also be applied to determine the restricted gain range and related limits.

Looking first to FIG. 5, an example embodiment 500 is shown where a minimum gain setting recorded during a sliding time window ($T_{SLIDE}$) 402 is used to set limits for the restricted gain range. For the example shown, the minimum gain setting 510 is recorded at time T1 during the sliding time window 402 and is used to set the restricted upper limit 511 for the gain adjustment phase 514. As shown during reception of the preamble 416 with respect to element 512, the gain for the receiver is increased as the input signal is low at time T2 and stops at the restricted upper limit 511 at time T2a although the signal level is still below the power level detection threshold 506. The receiver is then prepared to handle the highest of the interferers 503 as detected during the latest sliding time window 402. No further gain increase is made after time T2a even though the signal level is below saturation level due to the restricted gain range and related upper limit. Further, an interferer 503 occurring during the gain-freeze phase 516 between time T3 and time T4 does not cause saturation as indicated by gain increase 508 due to the restricted gain range and related upper limit. In contrast, as shown in the interferer tracking phase 404, a full gain range is used for the gain settings 124 to provide the amplified signal 504 and to make adjustments based upon interferers 503 received during this interferer tracking phase 404.

FIG. 6 is an example embodiment 600 of a timing diagram where a recurring interferer with a likelihood of occurrence above a selected threshold is detected and used to set limits for the restricted gain range. For example, a threshold of three occurrences within the sliding time window ($T_{SLIDE}$) 402 is used for this example embodiment. For the example shown, the minimum gain setting 510 is again recorded at time T1 during the sliding time window 402 but is not used to set limits for the restricted gain range because that gain level only occurred once during the sliding time window 402. The lowest gain setting with an occurrence above a predefined occurrence value (e.g., three) is the gain setting associated with low gain settings 606, 608, and 610, which are recorded at times T1a, T1b and T1c during the sliding time window 402. This gain level is used to set the restricted upper limit 611 for the gain adjustment phase 514. As shown during the reception of the preamble 416 with respect to element 612, the gain for the receiver is increased as the input signal is low at time T2 and stops at the restricted upper limit 611 at time T2a although the signal level is still below the power level detection threshold 506. The receiver is then prepared to handle the recurring interferers within interferers 503 as detected during the latest sliding time window 402. No further gain increase is made after time T2a even though the signal level is below saturation level due to the restricted gain range and related upper limit. Further, an interferer 503 occurring during the gain-freeze phase 516 between time T3 and time T4 does not cause saturation as indicated by gain increase 508 due to the restricted gain range and related upper limit. In contrast, as shown in the interferer tracking phase 404, a full gain range is used for the gain settings 124 to provide the amplified signal 504 and to make adjustments based upon interferers 503 received during this interferer tracking phase 404.

For the embodiments disclosed herein, it is also possible that interferers may occur during the gain adjustment phase 514 when the preamble 416 is being received. As such, the gain settings 124 for the receiver can also be recorded during or at the end of the gain adjustment phase 514 and stored in memory 122 along with other stored gain settings. This additional technique effectively adds the gain adjustment phase 514 to the sliding time window 402. These additional gain tracking points can be advantageous, for example, in cases of small time intervals between data frame reception periods. The gain controller 202 can also dynamically include or exclude the gain adjustment phase 514 during the preamble 416 from the sliding time window 402 in response to the particular data frame reception protocol being used. For one additional embodiment, interferer resilience is improved by monitoring the output of the power level detector 120 during the gain-freeze phase 516 for reception of the data payload. If the power level detector 120 indicates an excessively high signal level during this data payload period, the upper limit of the restricted gain range can be further decreased for the reception of the next data frame 415. Other variations can also be implemented while still taking advantage of the techniques described herein.

As described herein, a variety of embodiments can be implemented and different features and variations can be implemented, as desired.

For one embodiment, a receiver is disclosed including a RX front-end, a power level detector, and an AGC. The RX front-end includes one or more circuits having variable gains based upon gain settings, and the RX front-end has radio frequency (RF) signals as inputs and digital signals as outputs. The power level detector is coupled to receive inputs from the RX front-end and has a power level indicator as an output. The AGC is coupled to receive the power level indicator and has the gain settings as an output to the one or more circuits within the RX front-end. The AGC is also configured to adjust the gain settings within a first gain range when the RF signals do not include data frames and to adjust the gain settings within a second gain range when the RF signals include data frames. The second gain range is a restricted version of the first gain range.

In additional embodiments, the one or more circuits include at least one of an amplifier, a mixer, a filter, and an analog-to-digital converter. In further embodiments, the data frames include data frames according to at least one of the IEEE (Institute of Electrical and Electronics Engineers) 802.11 protocol or the IEEE 802.15.4 protocol. In further embodiments, the second gain range is used for gain adjustments only when a preamble for each data frame is received, and no gain adjustments are used when a payload for each data frame is received.

In additional embodiments, the AGC is further configured to detect and store gain settings within a sliding time window during a time when the RF signals do not include data frames and to use the stored gain settings to determine the second gain range. In further embodiments, the AGC is configured to detect and store the gain settings within the sliding time window at adjustable intervals.

In additional embodiments, the second gain range is based upon a lowest gain setting recorded within the sliding time window, and the lowest gain setting represents a largest interferer received during the sliding time window. In other additional embodiments, the second gain range is based upon a recurring lowest gain setting recorded within the sliding time window, and the recurring lowest gain setting is a lowest gain setting occurring more than a threshold number of times within the sliding time window.

In additional embodiments, the AGC is further configured to store gain settings during preamble reception for data frames. In further embodiments, the AGC is further configured not to detect and store gain settings when a co-located communication device is indicated.

For one embodiment, a method is disclosed including receiving radio frequency (RF) signals as inputs and outputting digital signals using a receive (RX) front-end comprising one or more circuits having variable gains based upon gain settings. The method also includes detecting power level for the RF signals within the RX front-end and generating a power level indicator and adjusting the gain settings for the one or more circuits based upon the power level indicator. The adjusting also includes adjusting the gain settings within a first gain range based upon the a power level indicator when the RF signals do not include data frames and adjusting the gain settings within a second gain range when the RF signals include data frames, the second gain range being a restricted version of the first gain range.

In additional embodiments, the one or more circuits include at least one of an amplifier, a mixer, a filter, and an analog-to-digital converter. In further embodiments, the data frames include data frames according to at least one of the IEEE (Institute of Electrical and Electronics Engineers) 802.11 protocol or the IEEE 802.15.4 protocol.

In additional embodiments, the method includes adjusting the gain settings using the second gain range only when a preamble for each data frame is received, and not adjusting the gain settings when a payload for each data frame is received.

In additional embodiments, the method includes detecting gain settings within a sliding time window during a time when the RF signals do not include data frames, storing the detected gain settings, and using the stored gain settings to determine the second gain range. In further embodiments, the method includes detecting and storing the gain settings within the sliding time window at adjustable intervals.

In additional embodiments, the second gain range is based upon a lowest gain setting recorded within the sliding time window, and the lowest gain setting represents a largest interferer received during the sliding time window. In other additional embodiments, the second gain range is based upon a recurring lowest gain setting recorded within the sliding time window, and the recurring lowest gain setting is a lowest gain setting occurring more than a threshold number of times within the sliding time window.

In additional embodiments, the method includes storing gain settings during preamble reception for data frames. In further embodiments, the method includes suspending the detection and storing of the gain settings when a co-located communication device is indicated.

It is further noted that the functional blocks, components, systems, devices, and/or circuitry described herein such as the RX front-end 104 (including the LNA 106, the mixer 108, the filter 110, and the ADC 112 as well as their component parts) and the processing unit 114 (including the frame acquisition logic 116 and the AGC 118 as well as their component parts) can be implemented using hardware, software, or a combination of hardware and software. For example, the disclosed embodiments can be implemented using one or more programmable circuits that are programmed to perform the functions, tasks, methods, actions, and/or other operational features described herein for the disclosed embodiments. The one or more programmable circuits can include, for example, one or more processors and/or configurable logic devices (CLDs). The one or more processors can be, for example, one or more central processing units (CPUs), controllers, microcontrollers, microprocessors, hardware accelerators, ASICs (application specific integrated circuit), and/or other integrated processing devices. The one or more CLDs can be, for example, one or more CPLDs (complex programmable logic devices), FPGAs (field programmable gate arrays), PLAs (programmable logic array), reconfigurable logic circuits, and/or other integrated logic devices. Further, the programmable circuits, including the one or more processors, can be programmed to execute software, firmware, code, and/or other program instructions that are embodied in one or more non-transitory tangible computer-readable mediums to perform the functions, tasks, methods, actions, and/or other operational features described herein for the disclosed embodiments. The programmable circuits, including the one or more CLDs, can also be programmed using logic code, logic definitions, hardware description languages, configuration files, and/or other logic instructions that are embodied in one or more non-transitory tangible computer-readable mediums to perform the functions, tasks, methods, actions, and/or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, and/or any other non-transitory tangible computer-readable mediums. Other variations can also be implemented while still taking advantage of the techniques described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A receiver, comprising:
   a receive (RX) front-end comprising one or more circuits having variable gains based upon gain settings, the RX front-end having radio frequency (RF) signals as inputs and digital signals as outputs;
   a power level detector coupled to receive inputs from the RX front-end and having a power level indicator as an output; and
   an automatic gain controller (AGC) coupled to receive the power level indicator and having the gain settings as an output to the one or more circuits within the RX front-end;
   wherein the AGC is configured to adjust the gain settings within a first gain range when the RF signals do not include data frames and to adjust the gain settings within a second gain range when the RF signals include data frames;
   wherein the second gain range is a restricted version of the first gain range; and
   wherein the AGC is further configured to detect and store gain settings within a sliding time window during a time when the RF signals do not include data frames and to use the stored gain settings to determine the second gain range.

2. The receiver of claim 1, wherein the one or more circuits comprise at least one of an amplifier, a mixer, a filter, and an analog-to-digital converter.

3. The receiver of claim 1, wherein the data frames comprise data frames according to at least one of the IEEE (Institute of Electrical and Electronics Engineers) 802.11 protocol or the IEEE 802.15.4 protocol.

4. The receiver of claim 1, wherein the second gain range is used for gain adjustments only when a preamble for each data frame is received, and wherein no gain adjustments are used when a payload for each data frame is received.

5. The receiver of claim 1, wherein the AGC is configured to detect and store the gain settings within the sliding time window at adjustable intervals.

6. The receiver of claim 1, wherein the second gain range is based upon a lowest gain setting recorded within the sliding time window, the lowest gain setting representing a largest interferer received during the sliding time window.

7. The receiver of claim 1, wherein the second gain range is based upon a recurring lowest gain setting recorded within the sliding time window, the recurring lowest gain setting being a lowest gain setting occurring more than a threshold number of times within the sliding time window.

8. The receiver of claim 1, wherein the AGC is further configured to store gain settings during preamble reception for data frames.

9. The receiver of claim 1, wherein the AGC is further configured not to detect and store gain settings when a co-located communication device is indicated.

10. A method, comprising:
receiving radio frequency (RF) signals as inputs and outputting digital signals using a receive (RX) front-end comprising one or more circuits having variable gains based upon gain settings;
detecting power level for the RF signals within the RX front-end and generating a power level indicator; and
adjusting the gain settings for the one or more circuits based upon the power level indicator;
wherein the adjusting comprises:
adjusting the gain settings within a first gain range based upon the a power level indicator when the RF signals do not include data frames, and
adjusting the gain settings within a second gain range when the RF signals include data frames, the second gain range being a restricted version of the first gain range; and
wherein the method further comprises detecting gain settings within a sliding time window during a time when the RF signals do not include data frames, storing the detected gain settings, and using the stored gain settings to determine the second gain range.

11. The method of claim 10, wherein the one or more circuits comprise at least one of an amplifier, a mixer, a filter, and an analog-to-digital converter.

12. The method of claim 10, wherein the data frames comprise data frames according to at least one of the IEEE (Institute of Electrical and Electronics Engineers) 802.11 protocol or the IEEE 802.15.4 protocol.

13. The method of claim 10, further comprising adjusting the gain settings using the second gain range only when a preamble for each data frame is received, and not adjusting the gain settings when a payload for each data frame is received.

14. The method of claim 10, further comprising detecting and storing the gain settings within the sliding time window at adjustable intervals.

15. The method of claim 10, wherein the second gain range is based upon a lowest gain setting recorded within the sliding time window, the lowest gain setting representing a largest interferer received during the sliding time window.

16. The method of claim 10, wherein the second gain range is based upon a recurring lowest gain setting recorded within the sliding time window, the recurring lowest gain setting being a lowest gain setting occurring more than a threshold number of times within the sliding time window.

17. The method of claim 10, further comprising storing gain settings during preamble reception for data frames.

18. The method of claim 10, further comprising suspending detection and storing of the gain settings when a co-located communication device is indicated.

* * * * *